(12) United States Patent
Lai et al.

(10) Patent No.: US 11,576,250 B1
(45) Date of Patent: Feb. 7, 2023

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Cheng-Hao Lai, Taichung (TW);
Ming-Hsun Tsai, Hsinchu (TW);
Hsin-Feng Chen, Yilan (TW);
Wei-Shin Cheng, Hsinchu (TW);
Yu-Kuang Sun, Hsinchu (TW);
Cheng-Hsuan Wu, New Taipei (TW);
Shang-Chieh Chien, New Taipei (TW);
Li-Jui Chen, Hsinchu (TW);
Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/445,430

(22) Filed: Aug. 19, 2021

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/005* (2013.01); *H05G 2/008* (2013.01)

(58) Field of Classification Search
CPC ........ H05G 2/006; H05G 2/005; H05G 2/008; G03F 7/70033
See application file for complete search history.

(56) References Cited

U.S. PATENT DOCUMENTS

2015/0230325 A1* 8/2015 Fleurov .................. H05G 2/008
250/214.1

\* cited by examiner

*Primary Examiner* — Nicole M Ippolito
*Assistant Examiner* — Hanway Chang
(74) *Attorney, Agent, or Firm* — Harrity & Harrity, LLP (57) ABSTRACT

Some implementations described herein provide techniques and apparatuses for an extreme ultraviolet (EUV) radiation source that includes a backsplash-prevention system to reduce, minimize, and/or prevent the formation of tin (Sn) build-up in a tunnel structure of a collector flow ring that might otherwise be caused by the accumulation of Sn satellites. This reduces backsplash of Sn onto a collector of the EUV radiation source, increases the operational life of the collector (e.g., by increasing the time duration between cleaning and/or replacement of the collector), reduces downtime of the EUV radiation source, and/or enables the performance of the EUV radiation source to be sustained for longer time durations (e.g., by reducing, minimizing, and/or preventing the rate of Sn contamination of the collector), among other examples.

20 Claims, 10 Drawing Sheets

SEMICONDUCTOR PROCESSING TOOL AND METHODS OF OPERATION

BACKGROUND

An extreme ultraviolet (EUV) radiation source includes a collector, which includes a curved mirror that is configured to collect EUV radiation and to focus the EUV radiation toward an intermediate focus near an intermediate focus cap (IF cap) of the EUV radiation source. The EUV radiation is produced from a laser produced plasma (LPP) that is generated by exposing droplets of tin (Sn) to a $CO_2$ laser. The Sn droplets are generated by a droplet generator (DG) head, which provides the Sn droplets into a vacuum chamber to an irradiation site where the Sn droplets are irradiated by a focused laser beam.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A technique for generating droplets in an extreme ultraviolet (EUV) radiation source involves melting a target material (e.g., tin (Sn)) and then forcing a stream of melted target material under high pressure through a nozzle of a droplet generator (DG) head. Mechanical disturbance is used to break up the stream of melted target material into droplets. In some cases, satellite droplets (which are referred to herein as Sn satellites) are formed when multiple microdroplets fail to combine or coalesce into a larger (main) droplet (which are referred to herein as coalesced Sn droplets).

In some cases, due to the small size and mass of the Sn satellites, the trajectory of the path of travel of the Sn satellites is easily manipulated. As a result, the Sn satellites may be deflected upward (e.g., away from a collector of the EUV radiation source) by a hydrogen ($H_2$) gas, which can cause the Sn satellites to deposit onto the ceiling or walls of a tunnel structure within a collector flow ring (CFR) above the collector. The Sn satellites deposited onto the ceiling and/or walls of the tunnel structure may accumulate and cause a build-up of Sn, which can block the flow of coalesced Sn droplets into an Sn catcher. The build-up may deflect coalesced Sn droplets (referred to as backsplash) back across the front of the collector, in which case the coalesced Sn droplets may deposit onto the collector. This can reduce the operational life of the collector, may cause increased downtime of the EUV radiation source (e.g., due to increased frequency of collector cleaning), and/or may decrease EUV radiation source performance.

Some implementations described herein provide techniques and apparatuses for an EUV radiation source that includes a backsplash-prevention system to reduce, minimize, and/or prevent the formation of Sn build-up in a tunnel structure of a CFR that might have otherwise been caused by the accumulation of Sn satellites in and/or on the tunnel structure. The backsplash-prevention system includes one or more types of backsplash-prevention reduction and/or prevention components, such as a heat-generating hardware component configured to liquify an Sn stalactite formed within the tunnel structure from the Sn satellites, a flowing gas component configured to change paths of the Sn satellite droplets flowing through the tunnel structure, and/or a vacuum pump configured to reduce a pressure at an exit region of the tunnel structure (which creates a vacuum force that contributes to changing paths of the Sn droplets and/or contributes to forces that extract liquified Sn residual from the tunnel structure), among other examples.

In this way, the backsplash-prevention system reduces, minimizes, and/or prevents the accumulation of Sn satellites within the tunnel structure (which might otherwise cause a build-up of Sn in the tunnel structure). This reduces backsplash of Sn onto the collector of the EUV radiation source, increases the operational life of the collector (e.g., by increasing the time duration between cleaning and/or replacement of the collector), reduces downtime of the EUV radiation source, and/or enables the performance of the EUV radiation source to be sustained for longer time durations (e.g., by reducing, minimizing, and/or preventing the rate of Sn contamination of the collector), among other examples.

Figure 1:
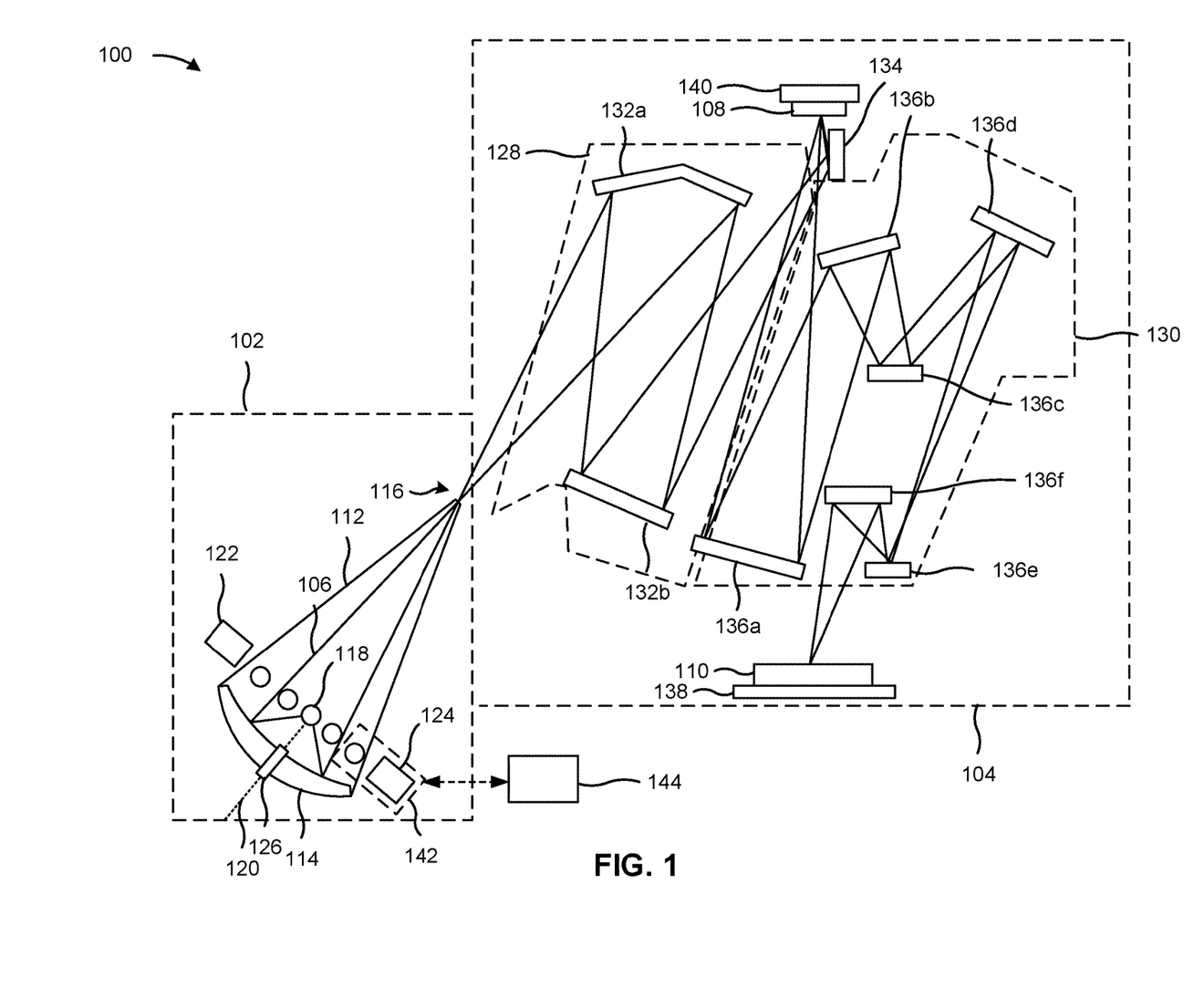
FIG. 1 is a diagram of an example lithography system described herein.

FIG. 1 is a diagram of an example of a lithography system 100 described herein. The lithography system 100 includes an EUV lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 (e.g., Sn droplets or another type of droplets) being exposed to a laser beam 120. The droplets 118 are provided across the front of the collector 114 by a droplet generator (DG) head 122. The DG head 122 is pressurized to provide a fine and controlled output of the droplets 118. After being exposed to the laser beam 120, the droplets 118 are gathered by a droplet catcher 124.

A laser source, such as a pulse carbon dioxide ($CO_2$) laser, generates the laser beam 120. The laser beam 120 is provided (e.g., by a beam delivery system to a focus lens) such that the laser beam 120 is focused through a window 126 of the collector 114. The laser beam 120 is focused onto the droplets 118 which generates the plasma. The plasma produces a plasma emission, some of which is the radiation 106. The laser beam 120 is pulsed at a timing that is synchronized with the flow of the droplets 118 from the DG head 122.

The exposure tool 104 includes an illuminator 128 and a projection optics box (POB) 130. The illuminator 128 includes a plurality of reflective mirrors that are configured to focus and/or direct the radiation 106 onto the reticle 108 so as to illuminate the pattern on the reticle 108. The plurality of mirrors include, for example, a mirror 132a and a mirror 132b. The mirror 132a includes a field facet mirror (FFM) or another type of mirror that includes a plurality of field facets. The mirror 132b includes a pupil facet mirror (PFM) or another type of mirror that also includes a plurality of pupil facets. The facets of the mirrors 132a and 132b are arranged to focus, polarize, and/or otherwise tune the radiation 106 from the radiation source 102 to increase the uniformity of the radiation 106 and/or to increase particular types of radiation components (e.g., transverse electric (1E) polarized radiation, transverse magnetic (TM) polarized radiation). Another mirror 134 (e.g., a relay mirror) is included to direct radiation 106 from the illuminator 128 onto the reticle 108.

The projection optics box 130 includes a plurality of mirrors that are configured to project the radiation 106 onto the semiconductor substrate 110 after the radiation 106 is modified based on the pattern of the reticle 108. The plurality of reflective mirrors include, for example, mirrors 136a-136f. In some implementations, the mirrors 136a-136f are configured to focus or reduce the radiation 106 into an exposure field, which may include one or more die areas on the semiconductor substrate 110.

The exposure tool 104 includes a substrate stage 138 (e.g., a wafer stage) configured to support the semiconductor substrate 110. Moreover, the substrate stage 138 is configured to move (or step) the semiconductor substrate 110 through a plurality of exposure fields as the radiation 106 transfers the pattern from the reticle 108 onto the semiconductor substrate 110. The exposure tool 104 also includes a reticle stage 140 that configured to support and/or secure the reticle 108. Moreover, the reticle stage 140 is configured to move or slide the reticle through the radiation 106 such that the reticle 108 is scanned by the radiation 106. In this way, a pattern that is larger than the field or beam of the radiation 106 may be transferred to the semiconductor substrate 110.

In an example exposure operation (e.g., an EUV exposure operation), the DG head 122 provides the stream of the droplets 118 across the front of the collector 114. The laser beam 120 contacts the droplets 118, which causes a plasma to be generated. The plasma emits or produces the radiation 106 (e.g., EUV light). The radiation 106 is collected by the collector 114 and directed out of the vessel 112 and into the exposure tool 104 toward the mirror 132a of the illuminator 128. The mirror 132a reflects the radiation 106 onto the mirror 132b, which reflects the radiation 106 onto the mirror 134 toward the reticle 108. The radiation 106 is modified by the pattern in the reticle 108. In other words, the radiation 106 reflects off of the reticle 108 based on the pattern of the reticle 108. The reflective reticle 108 directs the radiation 106 toward the mirror 136a in the projection optics box 130, which reflects the radiation 106 onto the mirror 136b. The radiation 106 continues to be reflected and reduced in the projection optics box 130 by the mirrors 136c-136f. The mirror 136f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

A backsplash condition may be avoided within the radiation source 102 with the addition of a backsplash-prevention system 142. The backsplash condition may have resulted from an accumulation of droplet material at an entry to the droplet catcher 124, where the accumulation of droplet material at or within the entry to the droplet catcher 124 prevented the droplets 118 from entering the droplet catcher 124 and created a backsplash of droplet material within the radiation source 102. The backsplash of the droplet material may have contaminated the collector 114, as described above.

In some implementations, the radiation source 102 includes the backsplash-prevention system 142 to prevent the accumulation of the droplet material at the entry to the droplet catcher 124. The backsplash-prevention system 142 may include one or more types of backsplash-prevention components and may be in communication with a controller 144. The controller 144 (e.g., a processor, a combination of a processor and memory, among other examples) may communicate with the backsplash-prevention system 142 to activate one or more of the backsplash prevention components to suppress the backsplash condition. Although illustrated as separate from the backsplash-prevention system 142 in FIG. 1, in some implementations, the controller 144 may be part of the backsplash-prevention system 142.

As indicated above, FIG. 1 is provided as an example. Other examples may differ from what is described with regard to FIG. 1. For example, another example may include additional components, fewer components, different components, or differently arranged components than those shown in FIG. 1. Additionally, or alternatively, a set of components (e.g., one or more components) of FIG. 1 may perform one or more functions described herein as being performed by another set of components.

Figure 2A:
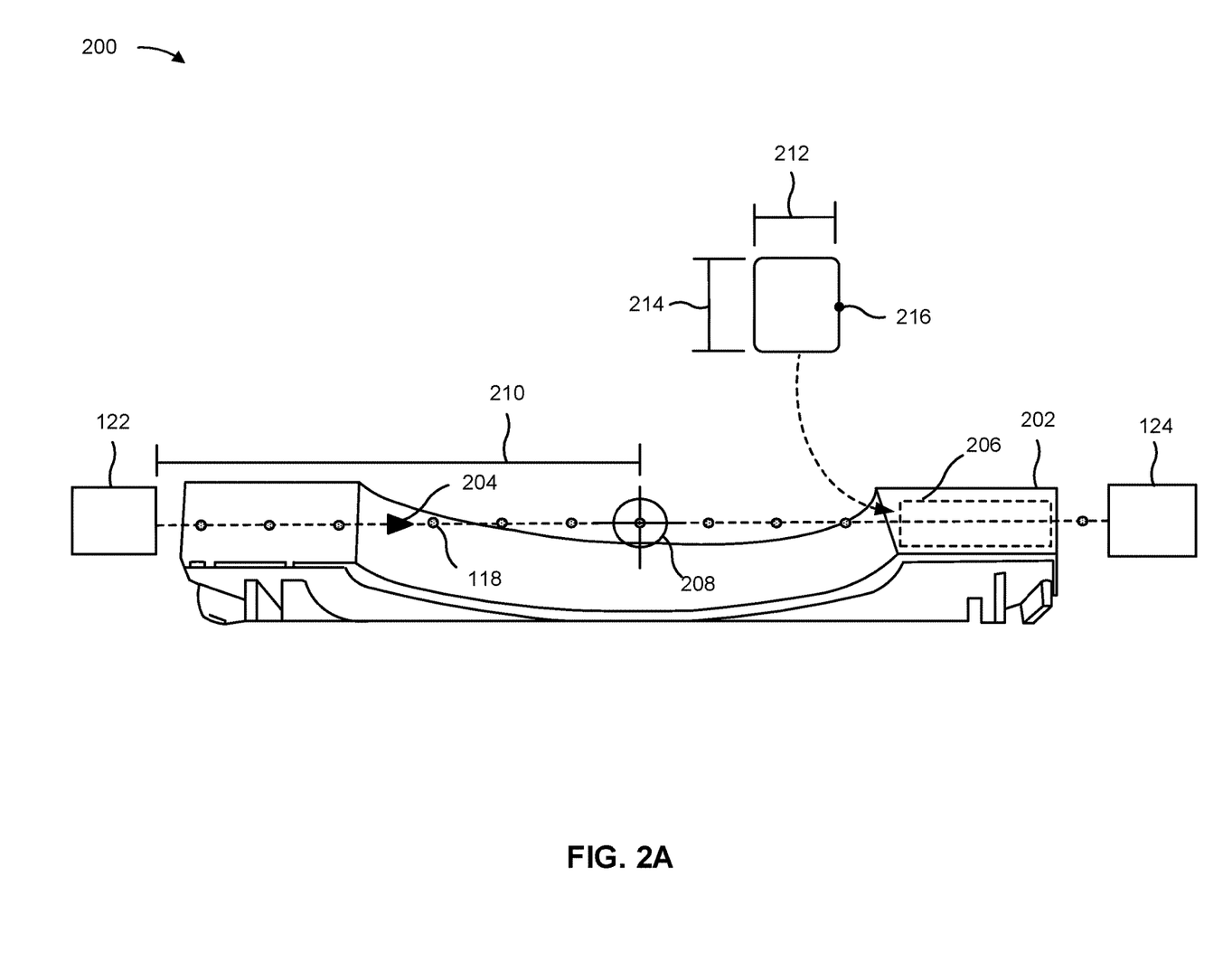
FIGS. 2A and 2B are diagrams of example implementations of a collector flow ring described herein.
Figure 2B:
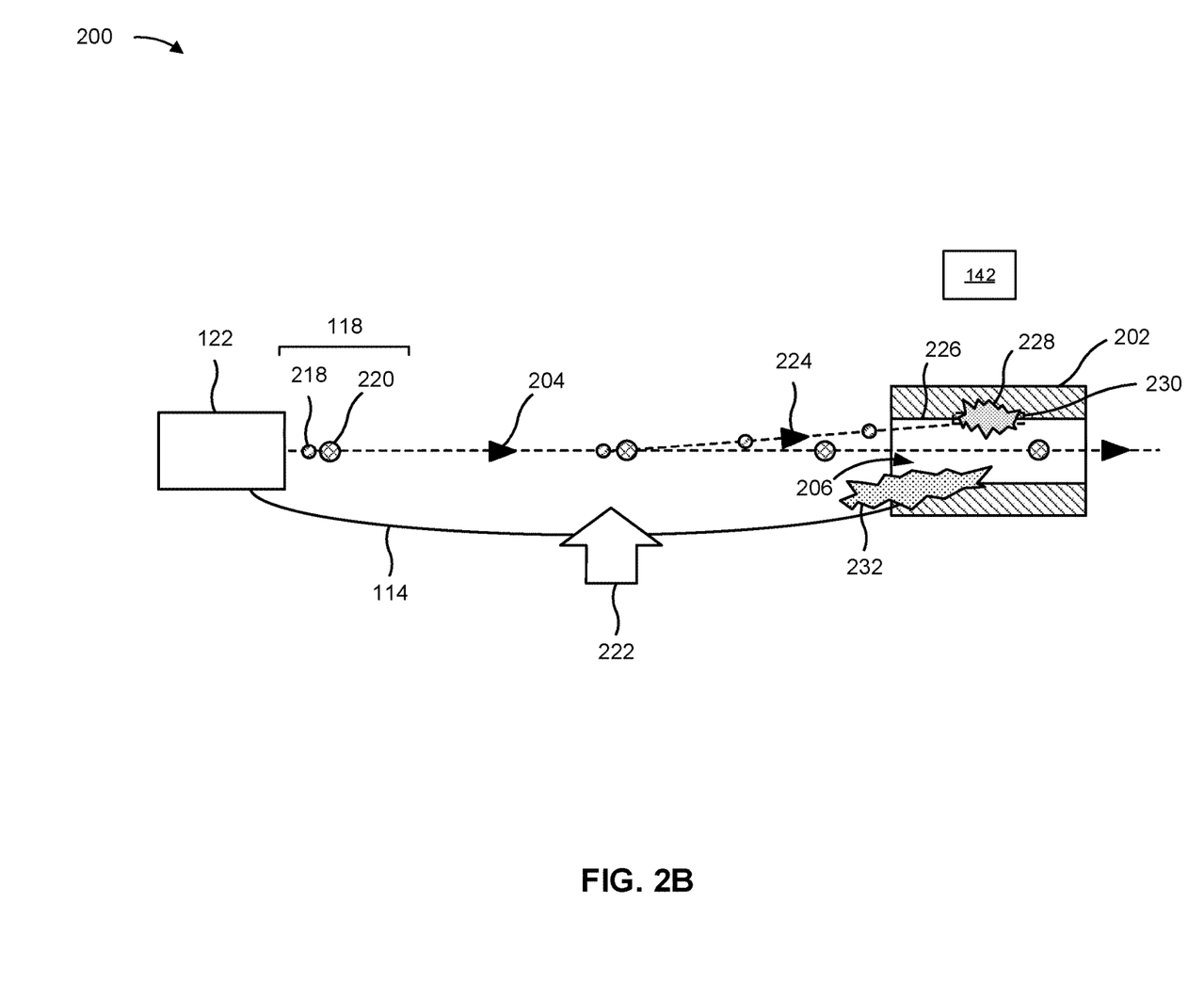

FIGS. 2A and 2B are diagrams of example implementations 200 of an example collector flow ring (CFR) 202 as described herein. The CFR 202 may be included in the vessel 112 of the radiation source 102 (e.g., an EUV radiation source). In particular, the CFR 202 may be included between the collector 114 and a vanes section of the vessel 112. The CFR 202 provides an entrance point for Sn droplets 118 into the vessel 112, and an exit point for the Sn droplets 118 (e.g., non-excited Sn droplets) out of the vessel 112. As shown in FIG. 2A, the DG head 122 projects a stream of the Sn droplets 118 along a path 204 (e.g., a first path) into a tunnel structure 206 that passes through the CFR 202 and leads to the Sn catcher 124.

In some implementations, a radiation region 208 (e.g., a region at which the Sn droplets 118 are exposed to the laser beam to generate plasma) is a distance 210 from a nozzle of the DG head 122. As an example, the distance 210 may be included in a range from approximately 340 millimeters (mm) to approximately 380 mm. However, other values for the distance 210 are within the scope of the present disclosure.

As shown in FIG. 2A, the tunnel structure 206 may have a cross-sectional shape that includes a generally rectangular shape. However, other cross-sectional shapes for the tunnel structure 206 are within the scope of the present disclosure, such as a circular shape, an oval shape, a polygon shape, among other examples. A cross-sectional width 212 of the tunnel structure 206 may be included in a range from approximately 6 mm to approximately 8 mm, and a cross-sectional height 214 of the tunnel structure may be included in a range from approximately 8 mm to approximately 12 mm. However, other values for the cross-sectional width 212 and the cross-sectional height 214 are within the scope of the present disclosure.

In some implementations, the tunnel structure 206 includes one or more sensors 216 configured to detect conditions within the tunnel structure 206. For example, the one or more sensors 216 may include a temperature sensor (e.g., a thermistor, a thermocouple, and/or a resistive temperature detector) to detect a temperature condition within the tunnel structure 206. Alternatively, or additionally, the one or more sensors 216 may include an image sensor to visually monitor Sn accumulation conditions within the tunnel structure 206.

As shown in FIG. 2B, the DG head 122 generates the stream of Sn droplets 118. To generate the stream of Sn droplets 118, the DG head 122 may melt Sn and force the melted Sn through a relatively small diameter nozzle (e.g., with a diameter in a range from approximately 0.5 microns to approximately 35 microns). The DG head 122 may apply mechanical disturbances to the melted Sn to cause the stream of Sn droplets 118 to form from the melted Sn. The stream of Sn droplets 118 is synchronized with pulses of the laser beam 120 by applying the mechanical disturbance at a same or similar frequency (or at higher harmonics of the frequency) as the repetition rate of pulsation of laser beam 120.

The mechanical disturbance includes a repetitive disturbance with an amplitude that is greater than the amplitude of random noise at the nozzle of the DG head 122. The mechanical disturbance may cause the melted Sn to break up into micro-droplets. A portion of the micro-droplets coalesce to become coalesced Sn droplets 220 of the Sn droplets 118. To cause multiple micro-droplets to coalesce together into a coalesced Sn droplet 220, the mechanical disturbance may be modulated to include multiple characteristic frequencies. The modulation frequency (or frequencies) causes micro-droplets to depart the nozzle at different velocities, thereby causing multiple micro-droplets to coalesce into a coalesced Sn droplet 220 after exiting the nozzle.

However, another portion of the micro-droplets fail to coalesce into coalesced Sn droplets 220 and instead become Sn satellites 218 of the Sn droplets 118. Micro-droplets may fail to coalesce as a result of inaccuracies in the mechanical disturbance, as a result of random or external noise of the DG head 122, as a result of jitter in the velocities of the micro-droplets, and/or as a result of one or more other factors. The Sn satellites 218 are smaller in size relative to the coalesced Sn droplets 220. As an example, a size (e.g., a diameter) of a coalesced Sn droplet 220 may be in a range from approximately 25 microns to approximately 30 microns, whereas a size (e.g., a diameter) of an Sn satellite 218 may be in a range from approximately 4 microns to approximately 8 microns. However, other values for the size of coalesced Sn droplets 220 and other values for the size of Sn satellites 218 are within the scope of the present disclosure.

In FIG. 2B, a gas flow 222 (e.g., a first gas flow) acts as a buffer and prevents the Sn satellites 218 and/or the coalesced Sn droplets 220 from accumulating on the collector 114. In some implementations, the gas flow 222 may include a hydrogen ($H_2$) gas and/or another type of gas.

As shown in FIG. 2B, the gas flow 222 may deflect smaller Sn particles (e.g., the Sn satellites 218) from the path 204 and onto a path 224 (e.g., a second path). The path 224 intersects with an interior surface 226 of the tunnel structure 206. In this instance, the Sn satellites 218 may accumulate to form a build-up of Sn in a region 230 of the interior surface 226 that is referred to as a stalactite 228. The stalactite 228 may include a build-up of Sn that becomes elongated and extends downward toward the center of the tunnel structure 206 from the region 230 of the interior surface 226 (e.g., from the top surface of the tunnel structure 206). In some implementations, the stalactite 228 occurs on other interior surfaces of the tunnel structure, such as a sidewall or a bottom surface of the tunnel structure 206. If not mitigated, the stalactite 228 may create, within the tunnel structure 206, a condition where a flow of the Sn satellites 218 and/or the coalesced Sn droplets 220 is impeded, causing a backsplash 232 to form within the tunnel structure 206 and encroach on surfaces of the collector 114. At least a portion of the backsplash 232 may be deflected by the stalactite 228 back into the vessel 112 between the inner diameter of the CFR 202, falling onto the collector 114. The presence of the backsplash 232 may compromise performance of the collector 114 (e.g., reduces reflectivity performance by up to approximately 50%), impacting yield of semiconductor devices fabricated using the lithography system 100 and causing downtime, unscheduled maintenance, or damage to the collector 114.

The path 224 may include different directional vector quantities. For example, portions of the path 224 may include an approximately straight vector quantity, an approximately curved vector quantity, or combinations thereof. Inertia and/or differences in momentum of the Sn satellites 218 (e.g., respective Sn satellites 218) and/or different velocities of the gas flow 222 may contribute to different directional vector quantities of the path 224.

Variations in the aforementioned dimensions of FIG. 2A (e.g., the distance 210, the cross-sectional width 212, and the cross-sectional height 214) may impact performance and/or architecture of the radiation source 102. For example, maintaining the distance 210 from 340 mm to 380 mm may minimize deflections of the Sn droplets 118 onto paths that collide with the CFR 202 or with a surface of the tunnel structure 206, aiding to suppress or avoid a backsplash condition that contaminates the collector 114 (e.g., a backsplash of Sn onto the collector 114). Furthermore, maintaining distance 210 from 340 mm to 380 mm may maintain an overall area of the collector 114 to achieve a targeted amount of energy to be reflected by the collector 114. In some implementations, changing dimensions associated with the CFR 202 (e.g., the distance 210) may change a trajectory of the Sn satellites 218 (e.g., a directional vector quantity of the path 224).

With respect to dimensions of the tunnel structure 206, maintaining the cross-sectional width 212 in a range from 6 mm to 8 mm and/or the cross-sectional height 214 beyond 12 mm allows the tunnel structure 206 to fit within nominal dimensions of the CFR 202, and provide enough of an area to capture the Sn droplets 118 as the Sn droplets 118 exit from the CFR 202 (and into the Sn catcher 124).

The backsplash-prevention system 142 (e.g., with one or more backsplash-prevention components) may be included in, attached to, or operationally connected with the tunnel structure 206 of the CFR 202. The backsplash-prevention system 142 (and/or one or more backsplash-prevention components thereof) is configured to remove and/or prevent the formation of stalactites 228 and/or other types of Sn build-up on the interior surfaces 226 of the tunnel structure 206, including the top surface, the sidewalls, and/or the bottom surface of the tunnel structure 206. In this way, the backsplash-prevention system 142 reduces, mitigates, and/or prevents the backsplash 232.

As indicated above, FIGS. 2A and 2B are provided as examples. Other examples may differ from what is described with regard to FIGS. 2A and 2B. For example, another example may include additional components, fewer components, different components, or differently arranged components than those shown in FIGS. 2A and 2B. Additionally, or alternatively, a set of components (e.g., one or more components) of FIGS. 2A and 2B may perform one or more functions described herein as being performed by another set of components.

Figure 3A:
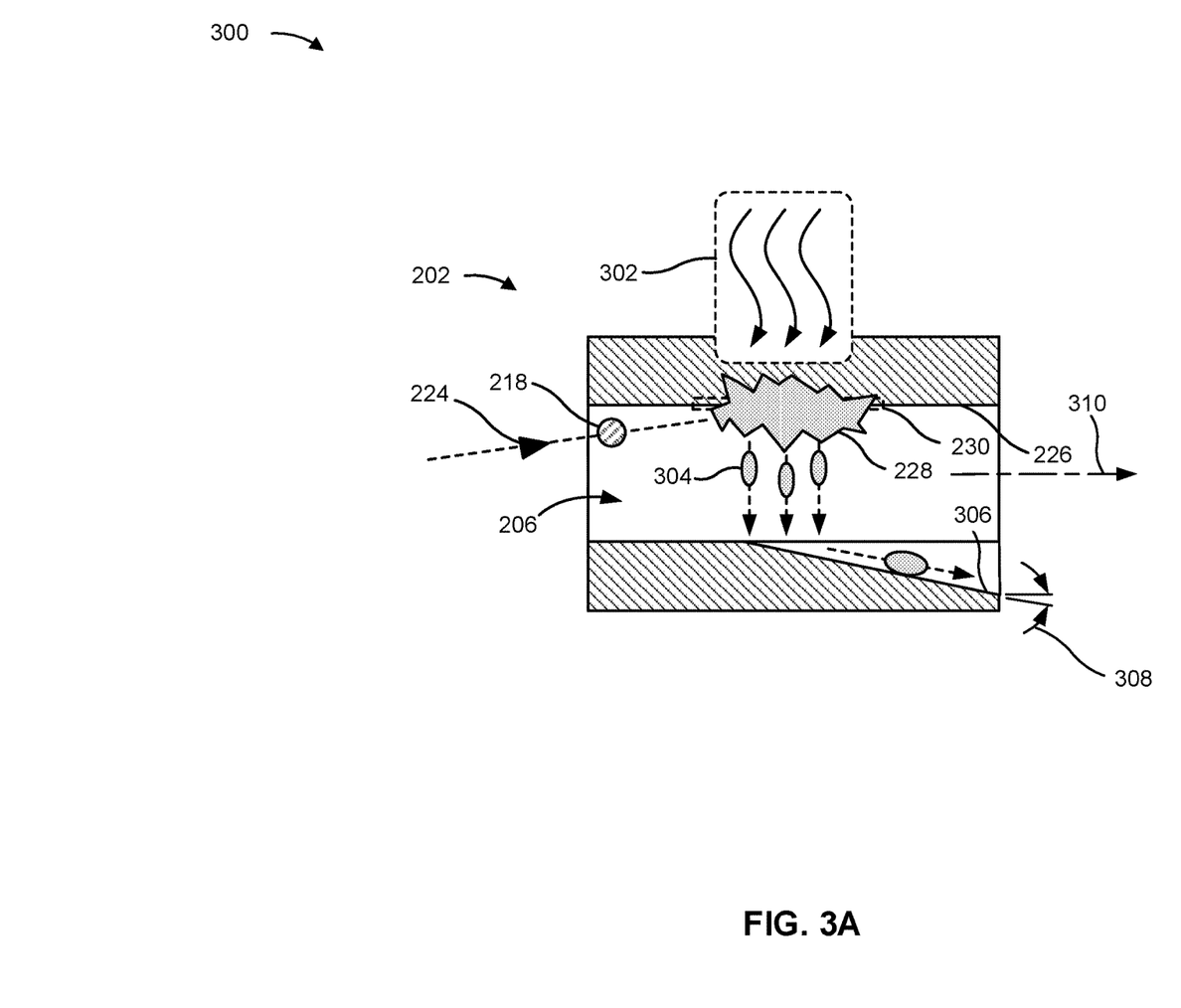
FIGS. 3A-3C are diagrams of example backsplash-prevention components described herein.
Figure 3B:
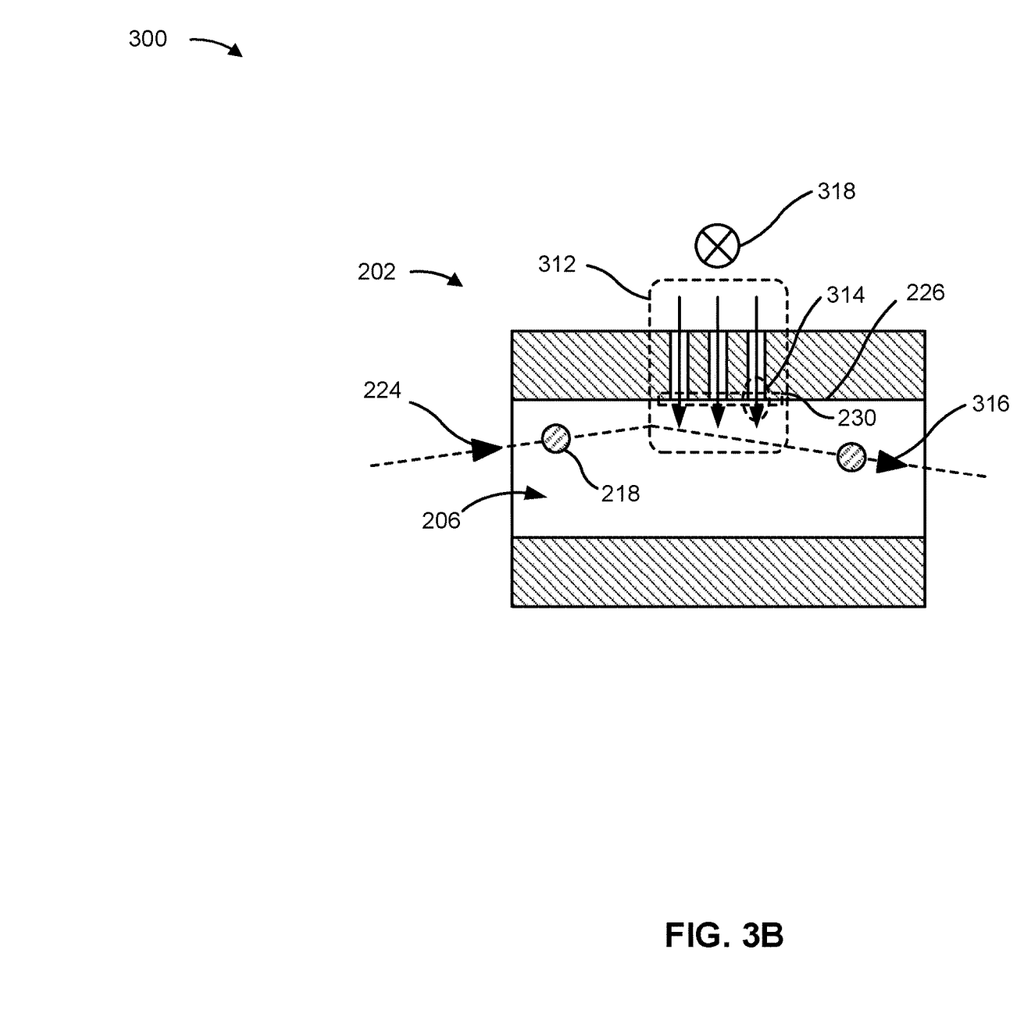
Figure 3C:
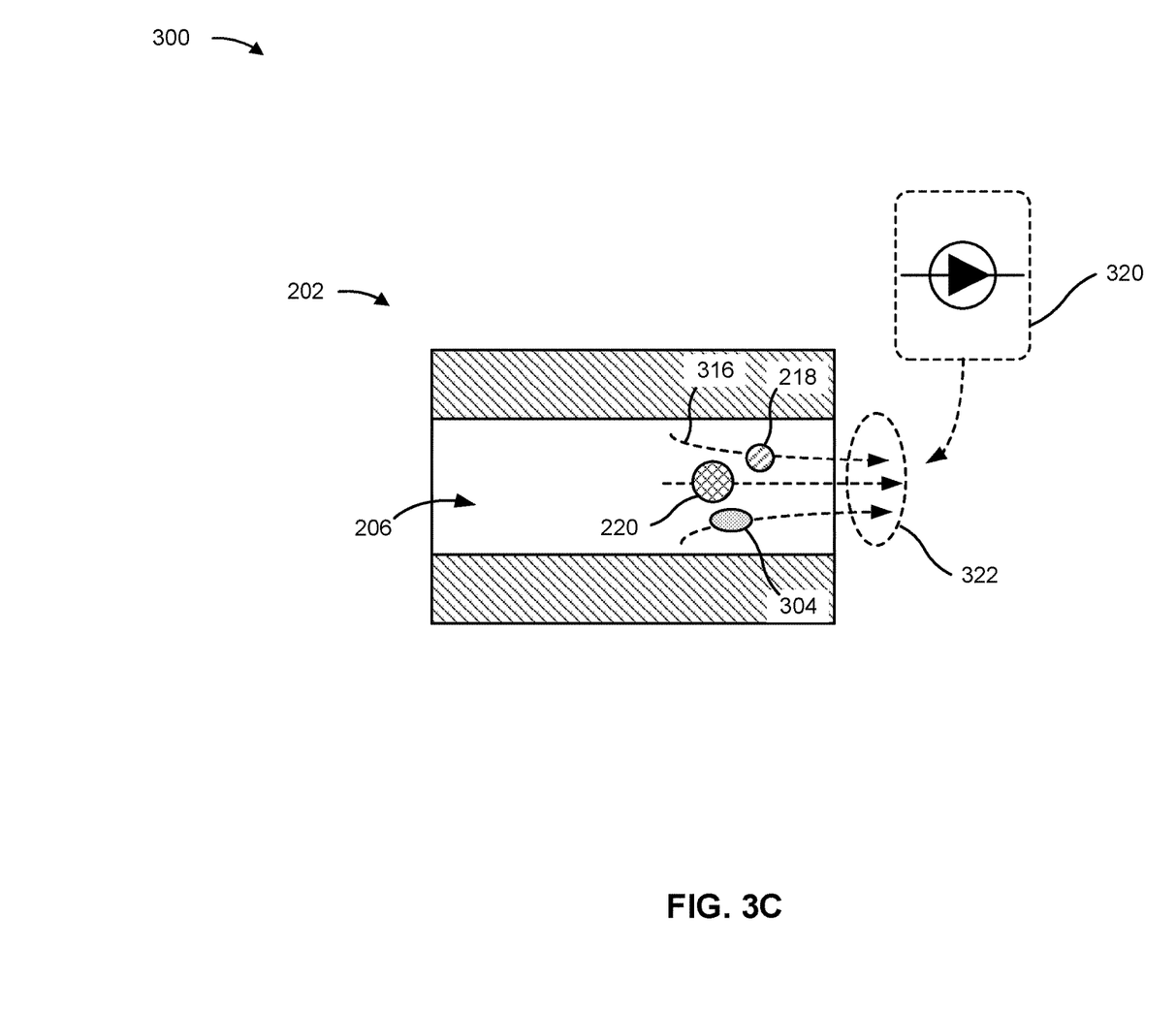

FIGS. 3A-3C are cross-section diagrams 300 of example implementations of backsplash-prevention components as described herein. The example backsplash-prevention components may be included in, attached to, or operationally connected with the tunnel structure 206 of the CFR 202 as part of the backsplash-prevention system 142. The example backsplash-prevention components may be included in and/or on the CFR 202, in and/or on the tunnel structure 206, and/or in another location of the radiation source 102. The example backsplash-prevention components are configured to reduce, minimize, and/or prevent build-up of Sn in and/or around the tunnel structure 206 (as described in connection with the example of FIG. 2B), and/or are configured to reduce, minimize, and/or prevent the backsplash 232 from reducing the cleanliness and the performance of the collector 114 (as described in connection with the example of FIG. 2B).

FIG. 3A shows an example backsplash-prevention component that includes a heat-generating hardware component 302. As shown in FIG. 3A, the Sn satellites 218 travel along the path 224 that intersects with the interior surface 226. As the Sn satellites 218 accumulate, the stalactite 228 forms within the region 230.

In some implementations, the heat-generating hardware component 302 may include a resistive heating component that surrounds at least a portion of the tunnel structure 206, including the region 230. Examples of types of resistive heating components include a sheath heater, a coiled heating wire, and/or another type of resistive heating component. In some implementations, other types of heating components are included in addition (or alternatively) to the resistive heating component. The heat-generating hardware component 302 is configured to provide heat to the region 230 (and/or to other regions of the interior surface 226) using conduction heat-transfer mechanics. In some implementations, the heat-generating hardware component 302 may include an infrared heater that is configured to provide heat to the region 230 using radiation heat-transfer mechanics.

The heat-generating hardware component 302 (e.g., heat from the heat-generating hardware component 302) may heat the region 230 to liquify or melt the stalactite 228 to create a liquified Sn residual 304 that flows into the tunnel structure 206. The liquified Sn residual 304 may be removed from the tunnel structure 206 (e.g., by gravitational force or by an active force provided by another component such as vacuum pump). The controller 144 may activate the heat-generating hardware component 302 or adjust an amount of heat provided to the region 230 (e.g., adjust a setting of the heat-generating hardware component 302) based on one or more factors. Examples of such factors include a detected temperature of the interior surface 226, one or more parameters of an exposure operation being performed by the radiation source 102, a result of an image analysis of the interior surface 226, and/or an output of a machine-learning model indicating a likelihood of Sn accumulation, among other examples.

The heat-generating hardware component 302 may heat the region 230 to a temperature that is in a range from approximately 240 degrees Celsius (° C.) to approximately 280° C. As the melting temperature of Sn is approximately 230° C., heating the region 230 to a temperature that is at least approximately 240° C. may adequately liquify the stalactite 228 into the liquified Sn residual 304 (to prevent the Sn satellites 218 from being blocked), and that is not more than approximately 280° C. may minimize (or prevent) undue sputtering of Sn particles from the radiation source 102 into the exposure tool 104 that can result in contamination to the reticle 108.

In some implementations, the tunnel structure 206 includes a channel having a surface 306 that is configured to promote a flow of the liquified Sn residual 304 to the Sn catcher 124. In some implementations, the surface 306 slopes at an angle 308 that is in a range from approximately 20 degrees)(° to approximately 40° relative to a path passing through a logical central axis 310 of the tunnel structure 206. Implementing the angle 308 of at least approximately 20° promotes the flow of the liquified Sn residual 304 out of the CFR 202 (e.g., into the Sn catcher 124), and that is not more than approximately to 40° maintains a form factor (e.g., size, dimensions) of the CFR 202.

Interior surfaces of the tunnel structure 206, including the interior surface 226 and the channel having the surface 306, may be coated with a material to reduce adhesion of the Sn satellites 218, the coalesced Sn droplets 220, the stalactite 228, and/or the liquified Sn residual 304. As an example, a molybdenum (Mo) material may coat the interior surfaces. However, other materials may be used as a coating on the interior surface 226.

FIG. 3B shows an example backsplash-prevention component that provides a gas flow 312 (e.g., a second gas flow)

to prevent the Sn satellites 218 from accumulating on the interior surface 226 of the tunnel structure 206. As shown in FIG. 3B, the Sn satellites 218 travel on the path 224 (e.g., the second path) that intersects with the interior surface 226. Also, as shown in FIG. 3B, the gas flow 312 deflects the Sn satellites 218 from the path 224 approximately onto a path 316 (e.g., a third path) to reduce a likelihood of the stalactite 228 from forming in the region 230.

The path 316 may include different directional vector quantities. For example, portions of the path 316 may include an approximately straight vector quantity, an approximately curved vector quantity, or combinations thereof. Differences in momentum of the Sn satellites 218 (e.g., respective Sn satellites 218) and/or different velocities of the gas flow 312 may contribute to different directional vector quantities of the path 316.

In some implementations, the gas flow 312 is expelled through one or more ports 314 within the interior surface 226 of the tunnel structure 206. The gas flow 312 may include an $H_2$ gas and/or another type of gas. The gas flow 312 may be expelled at a flow rate that is in a range from approximately 20 standard liters per minute (slm) to approximately 80 slm. Expelling the gas flow 312 at the flow rate that is at least approximately 20 slm may provide a force that is sufficient to deflect the Sn satellites 218 from the region 230 of the interior surface 226, and that is not more than approximately 80 slm may prevent deflecting the Sn satellites 218 into another region of the interior surface 226.

Furthermore, and in some implementations, the controller 144 adjusts the flow rate (e.g., by adjust a setting of a valve 318 that is configured to regulate the gas flow 312) and/or a temperature of the gas flow 312 (e.g., change a temperature setting at a source of the gas flow 312). The adjustments can be based on one or more factors. Examples of such factors include a detected temperature of the interior surface 226, one or more parameters of an exposure operation being performed by the radiation source 102, a result of an image analysis of the interior surface 226, and/or an output of a machine-learning model indicating a likelihood of Sn accumulation, among other examples.

FIG. 3C shows an example backsplash-prevention component that includes a vacuum pump 320. The vacuum pump 320 is configured to reduce a pressure at an exit region 322 of the tunnel structure 206 to create a vacuum force that contributes to deflecting the Sn satellites 218 from the path 224 onto the path 316. The vacuum force may also contribute to gravitational forces that extract the liquified Sn residual 304 and/or the coalesced Sn droplets 220 from the tunnel structure 206.

The vacuum pump 320 may reduce the pressure at the exit region 322 by an amount in a range from approximately 1.0 millibar (mbar) to approximately 2.5 mbar. Reducing the pressure by the amount in the range from approximately 1.0 mbar to approximately 2.5 mbar may provide a sufficiently strong vacuum force that contributes to the altering of paths of the Sn satellites 218 to prevent the formation of the stalactite 228 and also contribute to the extraction of the liquified Sn residual 304 and/or the coalesced Sn droplets 220. Reducing the pressure by the amount in the range from approximately 1.0 mbar to approximately 2.5 mbar may also maintain a velocity of flow of the coalesced Sn droplets 220 to enable synchronization of the coalesced Sn droplets 220 with pulses of the laser beam 120.

In some implementations, the vacuum pump 320 may be included in the Sn catcher 124 that is downstream from the tunnel structure 206. The controller 144 may activate the vacuum pump 320 and/or vary an amount of the pressure reduction the exit region 322 based on one or more factors. Examples of such factors include a detected temperature of the interior surface 226, one or more parameters of an exposure operation being performed by the radiation source 102, and/or a result of an image analysis of the interior surface 226, and/or an output of a machine-learning model indicating a likelihood of Sn accumulation, among other examples.

As indicated above, FIGS. 3A-3C are provided as examples. Other examples may differ from what is described with regard to FIGS. 3A-3C. For example, another example may include additional components, fewer components, different components, or differently arranged components than those shown in FIGS. 3A-3C. Additionally, or alternatively, a set of components (e.g., one or more components) of FIGS. 3A-3C may perform one or more functions described herein as being performed by another set of components.

Figure 4:
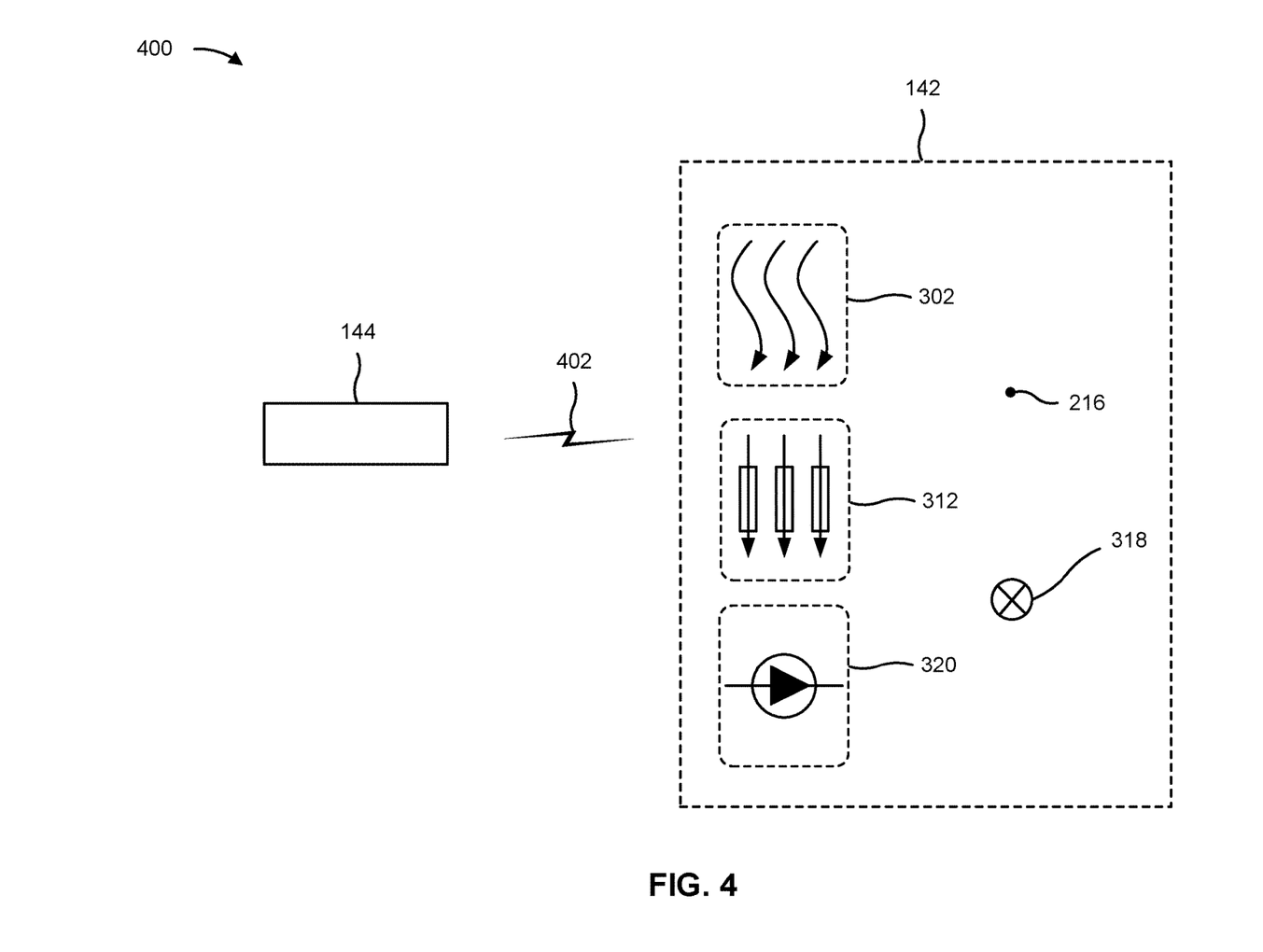
FIG. 4 is a diagram of an example implementation of a controller described herein.

FIG. 4 is a diagram of an example implementation 400 of a controller described herein. The example implementation 400 includes the controller 144 of FIG. 1 (e.g., a control system) that is configured to communicate with the backsplash-prevention system 142 of FIG. 1. As shown in the example implementation 400, the backsplash-prevention system 142 includes a plurality of the backsplash prevention components described in connection with FIGS. 3A-3C, such as the one or more sensors 216, the heat-generating hardware component 302, a source of the gas flow 312, the valve 318, and/or the vacuum pump 320. The backsplash-prevention system 142 may include a plurality of backsplash prevention components to further increase the backsplash prevention performance of the backsplash-prevention system 142. In some implementations, the backsplash-prevention system 142 includes one or two, and not all three, of the plurality of backsplash prevention components shown in FIG. 4. In some implementations, the backsplash-prevention system 142 includes at least one of the plurality of backsplash prevention components shown in FIG. 4 and at least one backsplash prevention component not shown in FIG. 4.

The controller 144 may transmit signals to or receive signals from one or more of the plurality of backsplash prevention components of the backsplash-prevention system 142 using one or more communication links 402 (e.g., one or more wireless-communication links, one or more wired-communication links, or a combination of a wireless-communication link and a wired-communication link). In some implementations, the signals may include individual signals, combinations or sequences of signals, and so on. The signals may indicate to the backsplash-prevention system 142 to activate, or adjust a settings of, a combination of the one or more of the plurality of backsplash prevention components of the backsplash-prevention system 142 to achieve a particular backsplash-prevention performance for the CFR 202.

In some implementations, the controller 144 is configured to use a machine-learning model, which is trained based on historical data, to make determinations for activating or adjusting a setting of one or more of the plurality of backsplash prevention components of the backsplash-prevention system 142. For example, the machine-learning model may correlate historical Sn accumulation rates and/or backsplash conditions with associated operating conditions and/or parameters during which historical Sn accumulation rates and/or backsplash conditions were generated. Examples of historical operating conditions and/or parameters include a measured temperature of the tunnel structure 206, maintenance log data associated with cleaning the CFR 202 and/or the collector 114, a flow rate of the gas flow 222, and/or yield rates for semiconductor devices fabricated using the lithography system 100, among other examples.

For a combination of operating conditions and/or parameters, the machine-learning model may have been trained to estimate one or more risk scores. A risk score may correspond to a probability (e.g., a percentage probability) of the Sn satellites 218 being deflected into the tunnel structure 206, a probability of the stalactite 228 forming within the tunnel structure 206, and/or a probability of the backsplash 232 forming on the collector 114, among other examples. The machine-learning model may have also been trained to assess the impact of activating, or adjusting a setting of, one or more of the plurality of backsplash-prevention components of the backsplash-prevention system 142 to these estimates.

In some implementations, the controller 144 activates, or adjusts a setting of, one or more of the plurality of backsplash-prevention components based on an output of the machine-learning model. For example, for an operating condition corresponding to a measured temperature of the tunnel structure being approximately 240° C. for a given flow rate of the gas flow 222, the machine-learning model may be used to predict that a probability of the Sn satellites 218 being deflected is 85%, the probability of the stalactite 228 forming within the tunnel structure 206 is 50%, and the probability of the backsplash 232 forming on the collector is 30%. Furthermore, the machine-learning model may be used to predict that activating the heat-generating hardware component 302 reduces the probability of the stalactite 228 forming within the tunnel structure 206 to 20% and reduces the probability of the backsplash forming on the collector to 10%. Based on the machine-learning model (e.g., the output of the machine-learning model), the controller 144 may transmit a signal to the heat-generating hardware component 302 to activate the heat-generating hardware component 302. The example described above (e.g., the operating condition corresponding to a measured temperature of the tunnel structure 206 being approximately 240° C. for a given flow rate of the gas) is but one of many examples that are within the scope of the present disclosure.

In some implementations, the controller 144 records data for the machine-learning model. For example, the controller 144 may record accumulation rates of Sn material within the tunnel structure 206 for a certain operating condition (e.g., data from an image sensor that captures images of the tunnel structure 206 to detect the accumulation of the Sn material) and provide the accumulation rates to update the machine-learning model. Thus, the machine-learning model may be updated, and improved, based on feedback from the controller 144.

As indicated above, FIG. 4 is provided as an example. Other examples may differ from what is described with regard to FIG. 4.

Figure 5:
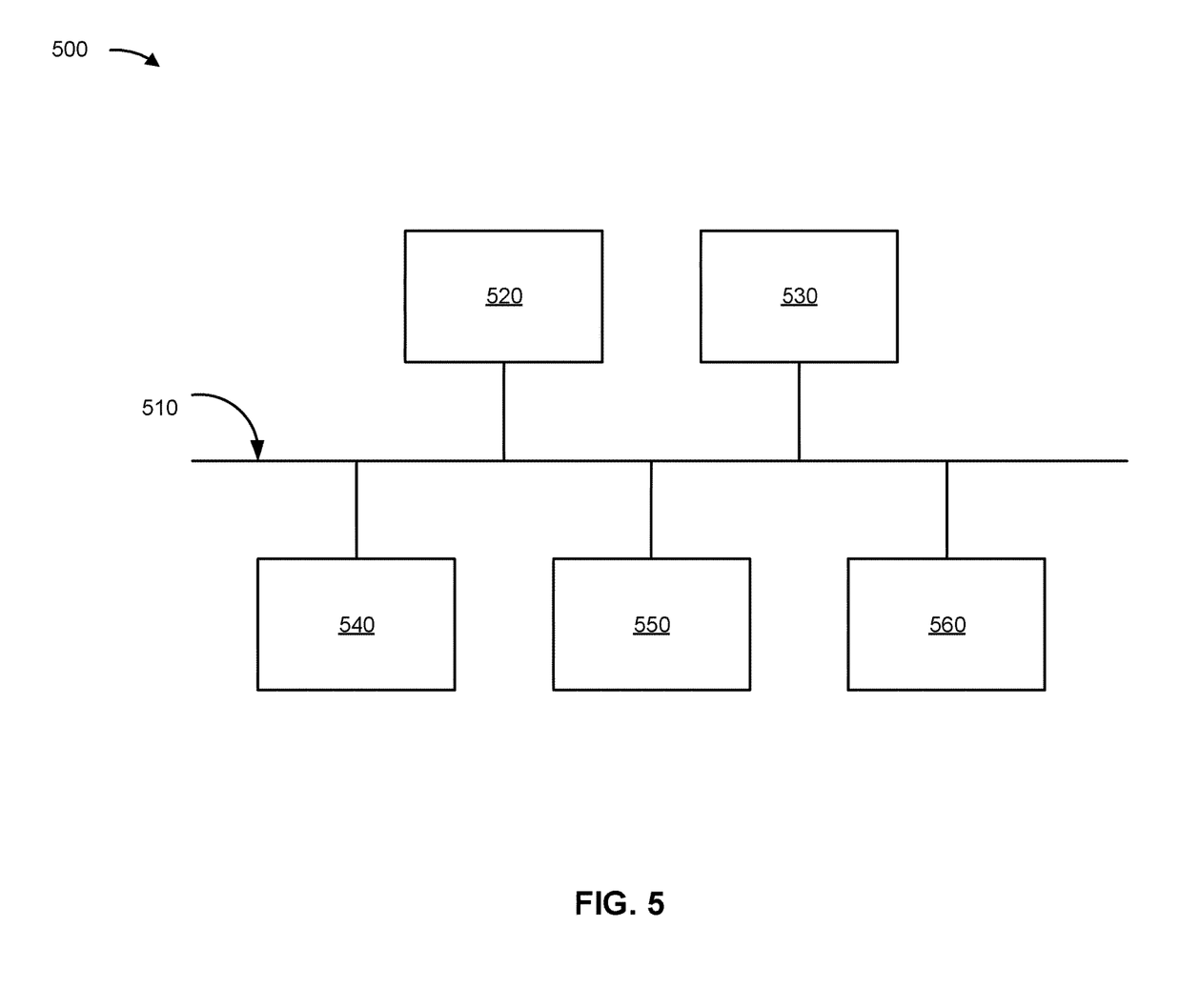
FIG. 5 is a diagram of example components of one or more devices of FIG. 1 described herein.

FIG. 5 is a diagram of example components of a device 500, which may correspond to the lithography system 100, the DG head 122, the CFR 202, the one or more sensors 216, the controller 144, the heat-generating hardware component 302, the valve 318, sources of the gas flows 222 and 312, and/or the vacuum pump 320. In some implementations, the lithography system 100, the DG head 122, the CFR 202, the one or more sensors 216, the controller 144, the heat-generating hardware component 302, the valve 318, sources of the gas flows 222 and 312, and/or the vacuum pump 320 may include one or more devices 500 and/or one or more components of device 500. As shown in FIG. 5, device 500 may include a bus 510, a processor 520, a memory 530, an input component 540, an output component 550, and a communication component 560.

Bus 510 includes one or more components that enable wired and/or wireless communication among the components of device 500. Bus 510 may couple together two or more components of FIG. 5, such as via operative coupling, communicative coupling, electronic coupling, and/or electric coupling. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform one or more operations or processes described elsewhere herein.

Memory 530 includes volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 includes one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry may be used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
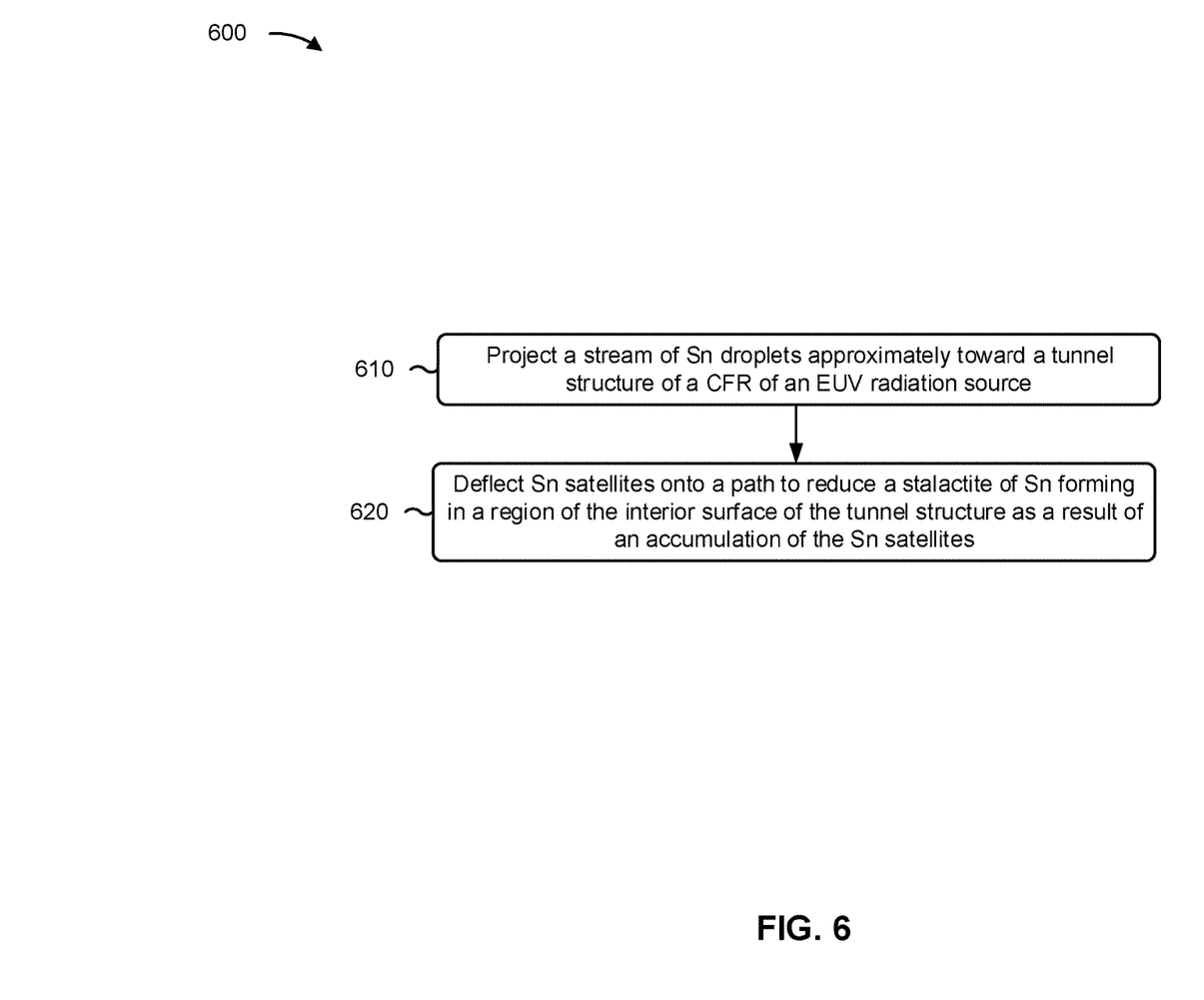
FIGS. 6 and 7 are flowcharts of example processes relating to reducing and/or preventing tin backsplash in a radiation source described herein.

FIG. 6 is a flowchart of an example process 600 associated with reducing and/or preventing tin backsplash in a radiation source described herein. In some implementations, one or more process blocks of FIG. 6 may be performed by a radiation source 102. In some implementations, one or more process blocks of FIG. 6 may be performed by another device or a group of devices separate from or included within the radiation source 102, such a controller (e.g., the controller 144), a DG head (e.g., the DG head 122), a component of a backsplash-prevention system (e.g., one or more sensors 216, the heat-generating hardware component 302, the gas flow 312, the vacuum pump 320), and/or processors of a lithography system (e.g., the lithography system 100), among other examples. Additionally, or alternatively, one or more process blocks of FIG. 6 may be performed or controlled by one or more components of device 500, such as processor 520, memory 530, input component 540, output component 550, and/or communication component 560.

As shown in FIG. 6, process 600 may include projecting a stream of Sn droplets toward a tunnel structure of a CFR of an EUV radiation source (block 610). For example, the DG head 122 may project a stream of Sn droplets 118 approximately along a first path 204 toward a tunnel structure 206 of a CFR 202 of the radiation source 102, as described above. In some implementations, the stream of Sn droplets 118 includes coalesced Sn droplets 220 and Sn satellites 218. In some implementations, a first gas flow 222 deflects the Sn satellites 218 from the first path 204 approximately onto a second path 224 that intersects with an interior surface 226 of the tunnel structure 206.

As further shown in FIG. 6, process 600 may include deflecting the Sn satellites onto a path to reduce a stalactite of Sn forming in a region of the interior surface of the tunnel structure as a result of an accumulation of the Sn satellites (block 620). For example, a second gas flow 312 may deflect the Sn satellites 218 from the second path 224 approximately onto a third path 316 to reduce a likelihood of a stalactite 228 of Sn forming in a region 230 of the interior surface 226 of the tunnel structure 206 as a result of an accumulation of the Sn satellites 218, as described above.

Process 600 may include additional implementations, such as any single implementation or any combination of implementations described below and/or in connection with one or more other processes described elsewhere herein.

In a first implementation, process 600 includes reducing a pressure at an exit region 322 of the tunnel structure 206 to create a vacuum force that contributes to the deflecting of the Sn satellites 218 from the second path 224 onto the third path 316.

In a second implementation, alone or in combination with the first implementation, reducing the pressure at the exit region 322 to create the vacuum force includes activating a vacuum pump 320 included in an Sn catcher 124 that is downstream of the tunnel structure 206. For example, the controller 144 may transmit a signal to the vacuum pump 320 to cause the vacuum pump 320 to be activated to create the vacuum force.

In a third implementation, alone or in combination with one or more of the first and second implementations, the vacuum force contributes to gravitational forces that extract the liquified Sn residual 304 from the tunnel structure 206. For example, the vacuum force may contribute to gravitational forces causing liquified Sn residual 304 to flow through a channel having a surface 306 that is configured to promote a flow of the liquified Sn residual 304 to an Sn catcher 124.

In a fourth implementation, alone or in combination with one or more of the first through third implementations, one or more ports 314 within the interior surface 226 of the tunnel structure 206 expel the second gas flow 312 into the tunnel structure 206.

In a fifth implementation, alone or in combination with one or more of the first through fourth implementations, the one or more ports 314 expel the second gas flow 312 at a flow rate that is in a range from approximately 20 slm to approximately 80 slm.

In a sixth implementation, alone or in combination with one or more of the first through fifth implementations, process 600 includes detecting a temperature of the interior surface 226 of the tunnel structure 206, and adjusting, based on the temperature, the flow rate of the second gas flow 312. For example, the one or more sensors 216 may detect a temperature of the interior surface 226 and transmit an indication of the temperature to the controller 144. The controller may then, based on the temperature, determine that conditions at interior surface 226 are conducive to Sn accumulation (e.g., below the melting point of Sn) and, to alleviate the conditions, transmit a signal to the valve 318 to cause the valve to increase the flow rate of the second gas flow 312.

In a seventh implementation, alone or in combination with one or more of the first through sixth implementations, process 600 includes detecting a temperature of the interior surface of the tunnel structure, and adjusting, based on the temperature, a temperature of the second gas flow. For example, the one or more sensors 216 may detect a temperature of the interior surface 226 and transmit an indication of the temperature to the controller 144. The controller may then, based on the temperature, determine that conditions at interior surface 226 are conducive to Sn accumulation (e.g., below the melting point of Sn) and, to alleviate the conditions, transmit a signal to heating component included in a source supplying the second gas flow 312 and increase the temperature of the second gas flow 312.

In an eighth implementation, alone or in combination with one or more of the first through seventh implementations, the second gas flow 312 includes hydrogen ($H_2$) gas.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
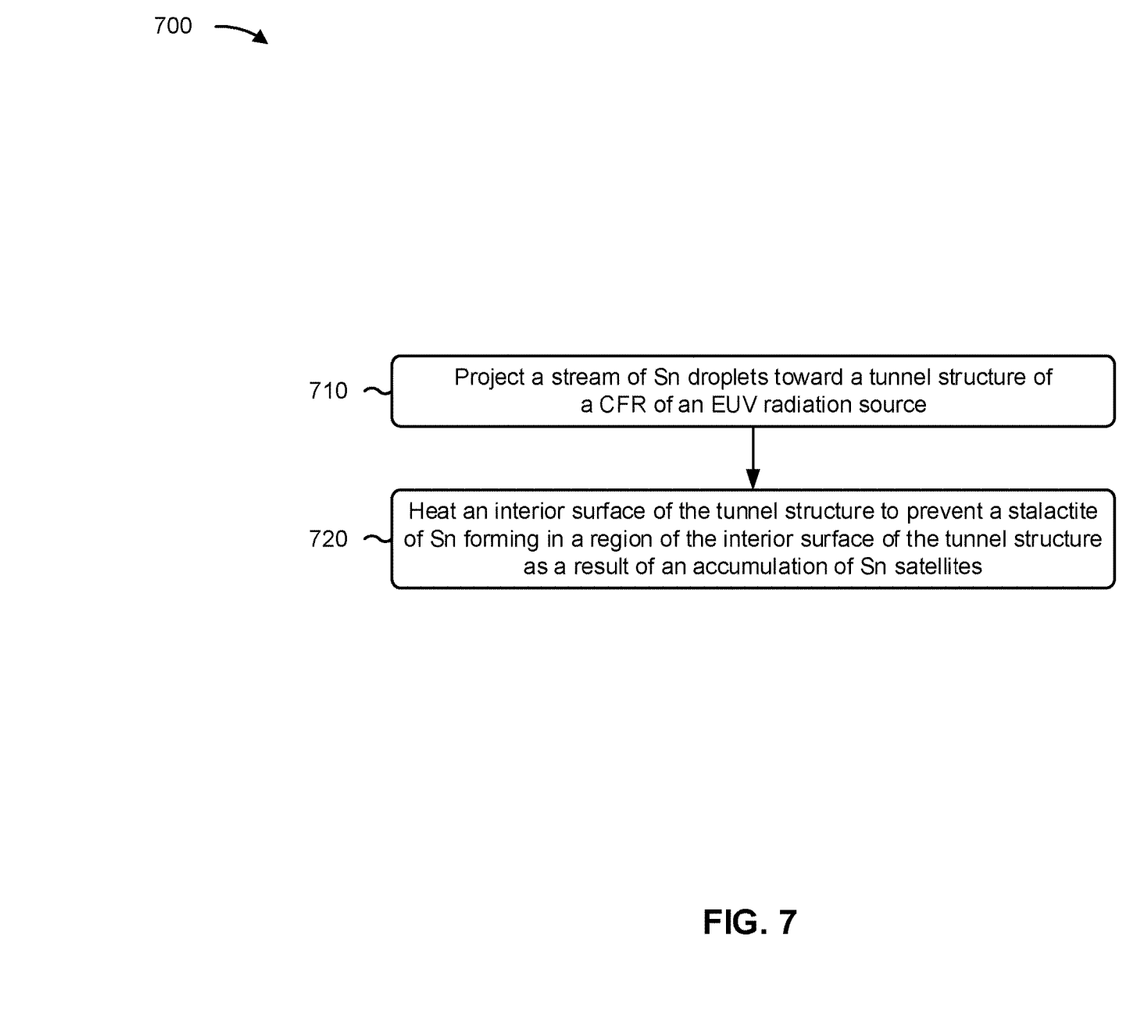

FIG. 7 is a flowchart of an example process 700 associated with semiconductor processing tool and methods of operation. In some implementations, one or more process blocks of FIG. 7 may be performed by a radiation source 102. In some implementations, one or more process blocks of FIG. 7 may be performed by another device or a group of devices separate from or included within the radiation source 102, such a controller (e.g., the controller 144), a DG head (e.g., the DG head 122), a component of a backsplash-prevention system (e.g., one or more sensors 216, the heat-generating hardware component 302, the gas flow 312, the vacuum pump 320), and/or processors of a lithography system (e.g., the lithography system 100), among other examples. Additionally, or alternatively, one or more process blocks of FIG. 7 may be performed or controlled one or more components of device 500, such as processor 520, memory 530, input component 540, output component 550, and/or communication component 560.

As shown in FIG. 7, process 700 may include projecting a stream of Sn droplets toward a tunnel structure of a CFR of an EUV radiation source (block 710). For example, a DG head 122 may project a stream of Sn droplets 118 approximately along a first path 204 toward a tunnel structure 206 of a CFR 202 of the radiation source 102. In some implementations, the stream of Sn droplets 118 includes coalesced Sn droplets 220 and Sn satellites 218, and a first gas flow 222 deflects the Sn satellites 218 from the first path 204 approximately onto a second path 224 that intersects with an interior surface 226 of the tunnel structure 206, as described above.

As further shown in FIG. 7, process 700 may include heating the interior surface of the tunnel structure to prevent a likelihood of a of Sn forming in a region of the interior surface of the tunnel structure as a result of an accumulation of the Sn satellites (block 720). For example, the heat-generating hardware component 302 may heat the interior surface 226 of the tunnel structure 206 to prevent a stalactite 228 of Sn forming in a region 230 of the interior surface 226 of the tunnel structure 206 as a result of an accumulation of the Sn satellites, as described above.

Process 700 may include additional implementations, such as any single implementation or any combination of implementations described below and/or in connection with one or more other processes described elsewhere herein.

In a first implementation, process 700 includes reducing a pressure at an exit region 322 of the tunnel structure 206 to create a vacuum force that redirects at least a portion of the Sn satellites 218 from the second path 224 approximately onto a third path 316 that does not intersect with the interior surface 226 of the tunnel structure 206. For example, the controller 144 may transmit a signal to the vacuum pump 320 to cause the vacuum pump 320 to be activated to create the vacuum force.

In a second implementation, alone or in combination with the first implementation, reducing the pressure at the exit region of the tunnel structure includes reducing the pressure by an amount in a range from approximately 1.0 millibar (mbar) to approximately 2.5 mbar.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

As described above, the backsplash-prevention system reduces, minimizes, and/or prevents the accumulation of Sn satellites within the tunnel structure (which might otherwise cause a build-up of Sn in the tunnel structure). This reduces backsplash of Sn onto the collector of the EUV radiation source, increases the operational life of the collector (e.g., by increasing the time duration between cleaning and/or replacement of the collector), reduces downtime of the EUV radiation source, and/or enables the performance of the EUV radiation source to be sustained for longer time durations (e.g., by reducing, minimizing, and/or preventing the rate of Sn contamination of the collector), among other examples.

As described in greater detail above, some implementations described herein provide a method. The method includes projecting, by a DG head of an EUV radiation source, a stream of Sn droplets approximately along a first path toward a tunnel structure of a CFR of the EUV radiation source, where the stream of Sn droplets includes coalesced Sn droplets and Sn satellites, and where a first gas flow deflects the Sn satellites from the first path approximately onto a second path that intersects with an interior surface of the tunnel structure. The method includes deflecting, by a second gas flow, the Sn satellites from the second path approximately onto a third path to reduce a likelihood of a stalactite of Sn forming in a region of the interior surface of the tunnel structure as a result of an accumulation of the Sn satellites.

As described in greater detail above, some implementations described herein provide a method. The method includes projecting, by a DG head of an EUV radiation source, a stream of Sn droplets along a first path toward a tunnel structure of a CFR of the EUV radiation source, where the stream of Sn droplets includes coalesced Sn droplets and Sn satellites, and where a gas flow deflects the Sn satellites from the first path approximately onto a second path that intersects with an interior surface of the tunnel structure. The method includes heating, by a heat-generating hardware component, the interior surface of the tunnel structure to prevent a likelihood of a stalactite of Sn forming in a region of the interior surface of the tunnel structure as a result of an accumulation of the Sn satellites.

As described in greater detail above, some implementations described herein provide a radiation source. The radiation source includes a DG head, a collector, an Sn catcher, and a CFR including a tunnel structure leading to an entrance point of the Sn catcher. The radiation source further includes a backsplash-prevention system that includes a plurality of types of backsplash-prevention components and a controller. The controller is configured to activate one or more of the plurality of types of backsplash-prevention components to prevent an accumulation of Sn satellites on a region of an interior surface of the tunnel structure and prevent backsplash of Sn onto the collector.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
projecting, by a droplet generator (DG) head of an extreme ultraviolet (EUV) radiation source, a stream of tin (Sn) droplets approximately along a first path toward a tunnel structure of a collector flow ring (CFR) of the EUV radiation source,
   wherein the stream of Sn droplets includes coalesced Sn droplets and Sn satellites, and
   wherein a first gas flow deflects the Sn satellites from the first path approximately onto a second path that intersects with an interior surface of the tunnel structure; and
deflecting, by a second gas flow, the Sn satellites from the second path approximately onto a third path to reduce a stalactite of Sn forming in a region of the interior surface of the tunnel structure as a result of an accumulation of the Sn satellites.

2. The method of claim 1, further comprising:
reducing a pressure at an exit region of the tunnel structure to create a vacuum force that contributes to the deflecting of the Sn satellites from the second path onto the third path.

3. The method of claim 2, wherein reducing the pressure at the exit region to create the vacuum force comprises:
activating a vacuum pump included in an Sn catcher that is downstream of the tunnel structure.

4. The method of claim 2, wherein the vacuum force contributes to gravitational forces that extract liquified Sn residual from the tunnel structure.

5. The method of claim 1, wherein one or more ports within the interior surface of the tunnel structure expel the second gas flow into the tunnel structure.

6. The method of claim 5, wherein the one or more ports expel the second gas flow at a flow rate that is in a range from approximately 20 standard liters per minute (slm) to approximately 80 slm.

7. The method of claim 6, further comprising:
detecting a temperature of the interior surface of the tunnel structure; and
adjusting, based on the temperature, the flow rate of the second gas flow.

8. The method of claim 1, further comprising:
detecting a temperature of the interior surface of the tunnel structure; and
adjusting, based on the temperature, a temperature of the second gas flow.

9. The method of claim 1, wherein the second gas flow comprises:
a hydrogen ($H_2$) gas.

10. A method, comprising:
projecting, by a droplet generator (DG) head of an extreme ultraviolet (EUV) radiation source, a stream of tin (Sn) droplets along a first path toward a tunnel structure of a collector flow ring (CFR) of the EUV radiation source,
wherein the stream of Sn droplets includes coalesced Sn droplets and Sn satellites, and
wherein a gas flow deflects the Sn satellites from the first path approximately onto a second path that intersects with an interior surface of the tunnel structure; and
heating, by a heat-generating hardware component, the interior surface of the tunnel structure to prevent a stalactite of Sn forming in a region of the interior surface of the tunnel structure as a result of an accumulation of the Sn satellites.

11. The method of claim 10, further comprising:
reducing a pressure at an exit region of the tunnel structure to create a vacuum force that redirects at least a portion of the Sn satellites from the second path approximately onto a third path that does not intersect with the interior surface of the tunnel structure.

12. The method of claim 11, further comprising:
detecting a temperature of the interior surface, and
wherein reducing the pressure at the exit region is based on the temperature.

13. The method of claim 11, wherein reducing the pressure at the exit region of the tunnel structure comprises:
reducing the pressure by an amount in a range from approximately 1.0 millibar (mbar) to approximately 2.5 mbar.

14. A radiation source, comprising:
a droplet generator (DG) head;
a collector;
a tin (Sn) catcher;
a collector flow ring (CFR) including a tunnel structure leading to an entrance point of the Sn catcher; and
a backsplash-prevention system coupled to the CFR and comprising:
a plurality of types of backsplash-prevention components; and
a controller configured to activate one or more of the plurality of types of backsplash-prevention components to prevent an accumulation of Sn satellites on a region of an interior surface of the tunnel structure and prevent backsplash of Sn onto the collector.

15. The radiation source of claim 14, wherein the tunnel structure comprises:
a channel having a surface that is configured to promote a flow of a liquified Sn residual to the Sn catcher and that slopes at an angle that is in a range from approximately 20 degrees($°$ to approximately 40° relative to a path passing through a logical central axis of the tunnel structure.

16. The radiation source of claim 14, wherein the interior surface of the tunnel structure is coated with a material including molybdenum (Mo).

17. The radiation source of claim 14, wherein the plurality of types of backsplash-prevention components comprises:
a heat-generating hardware component that is configured to provide heat to the region to liquify a stalactite of Sn formed on the region.

18. The radiation source of claim 17, wherein the heat-generating hardware component comprises:
a sheath heater that surrounds at least a portion of the tunnel structure and that is configured to provide, through conduction heat-transfer mechanics, the heat to the region.

19. The radiation source of claim 17, wherein the heat-generating hardware component comprises:
an infrared heater that is configured to provide, through radiation heat-transfer mechanics, the heat to the region.

20. The radiation source of claim 14, wherein the plurality of types of backsplash-prevention components comprises:
one or more ports that are within the interior surface of the tunnel structure; and
a valve to vary a rate of flow of a gas expelled through the one or more ports.

* * * * *